United States Patent [19]

Fuss et al.

[11] Patent Number: 4,498,123
[45] Date of Patent: Feb. 5, 1985

[54] UNIVERSAL CIRCUIT MODULE MOUNTING STRUCTURE

[75] Inventors: Peter S. Fuss, Glen Ellyn; Jerry J. Kosner, LaGrange, both of Ill.

[73] Assignee: Tellabs, Inc., Lisle, Ill.

[21] Appl. No.: 478,697

[22] Filed: Mar. 25, 1983

[51] Int. Cl.³ .............................................. H05K 1/18
[52] U.S. Cl. ................................... 361/427; 361/391; 361/420
[58] Field of Search ................. 211/41, 184; 248/298, 248/307, 544; 312/245, 330 R, 345; 307/147, 150; 361/331, 380, 334, 335, 339, 338, 390, 391, 392–395, 399, 413, 415, 386, 400, 417, 419, 420, 427

[56] References Cited

U.S. PATENT DOCUMENTS

| | | | |
|---|---|---|---|
| 2,660,506 | 11/1953 | Wright | 312/345 |
| 3,289,044 | 11/1966 | Ginsberg | 361/391 |
| 3,452,878 | 7/1969 | Smith | 211/162 |
| 3,973,814 | 8/1976 | Entrikin | 312/330 R |

Primary Examiner—G. P. Tolin
Attorney, Agent, or Firm—Gary, Juettner & Pyle

[57] ABSTRACT

A universal circuit module mounting structure is characterized by mounting hardware for a circuit module which enables the same to be mounted either between a pair of spaced channels or within circuit card guides. For mounting between the channels, L-shaped brackets are removably fastened to upper and lower ends of the module, upstanding legs of the brackets are apertured, the apertures are aligned with passages through the channels and fasteners extended through the apertures and passages secure the module to and between the channels. To mount the module within circuit card guides, generally U-shaped brackets are removably fastened to the module upper and lower ends, and outwardly extending legs of the brackets are slid within the card guides to mount the module therewithin.

6 Claims, 6 Drawing Figures

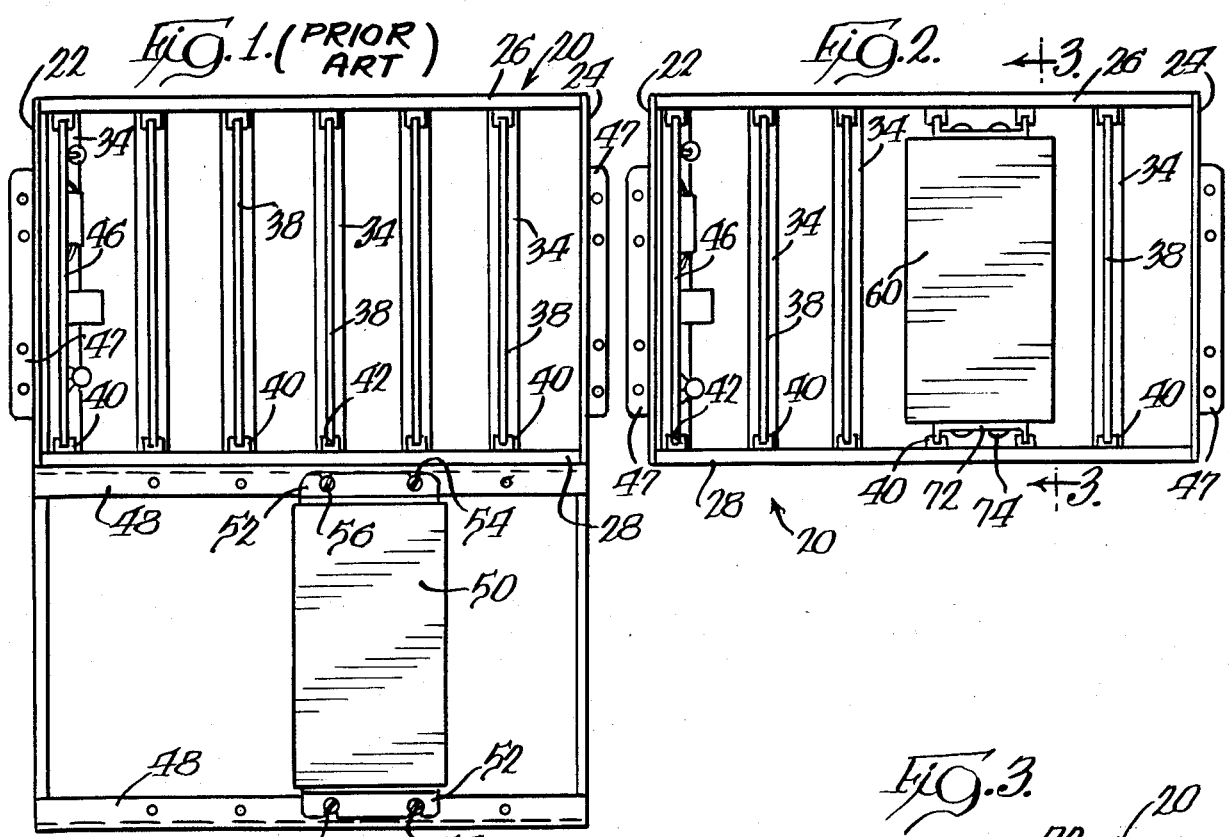
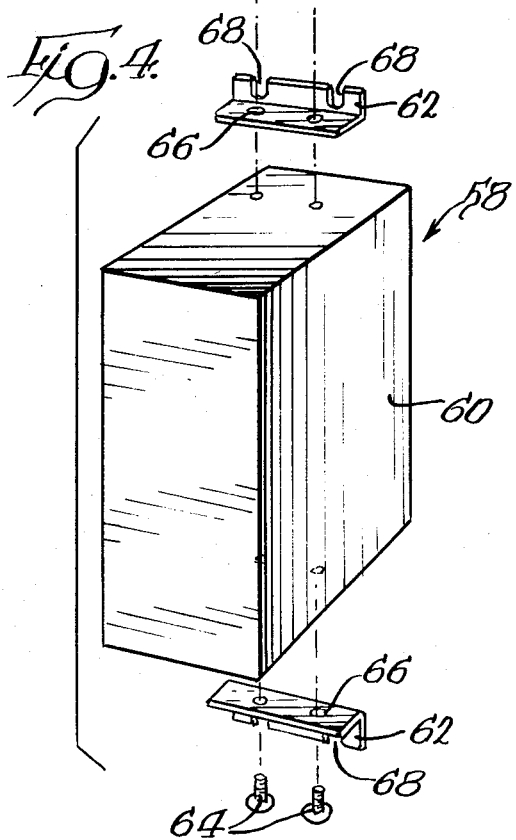
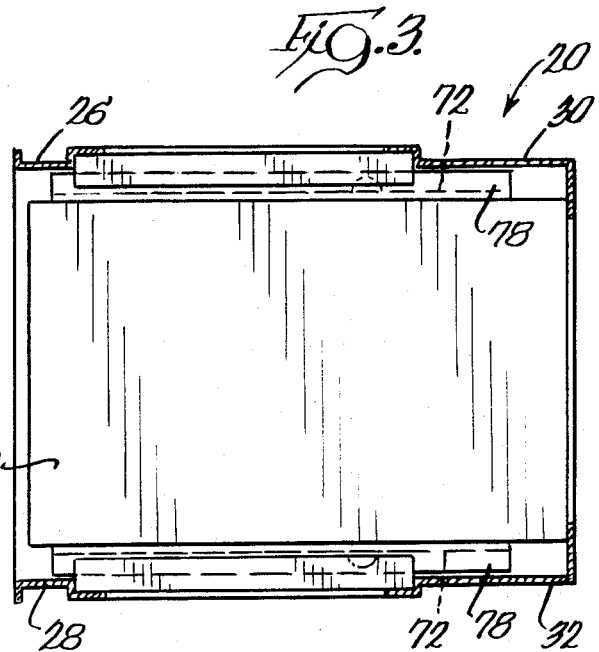

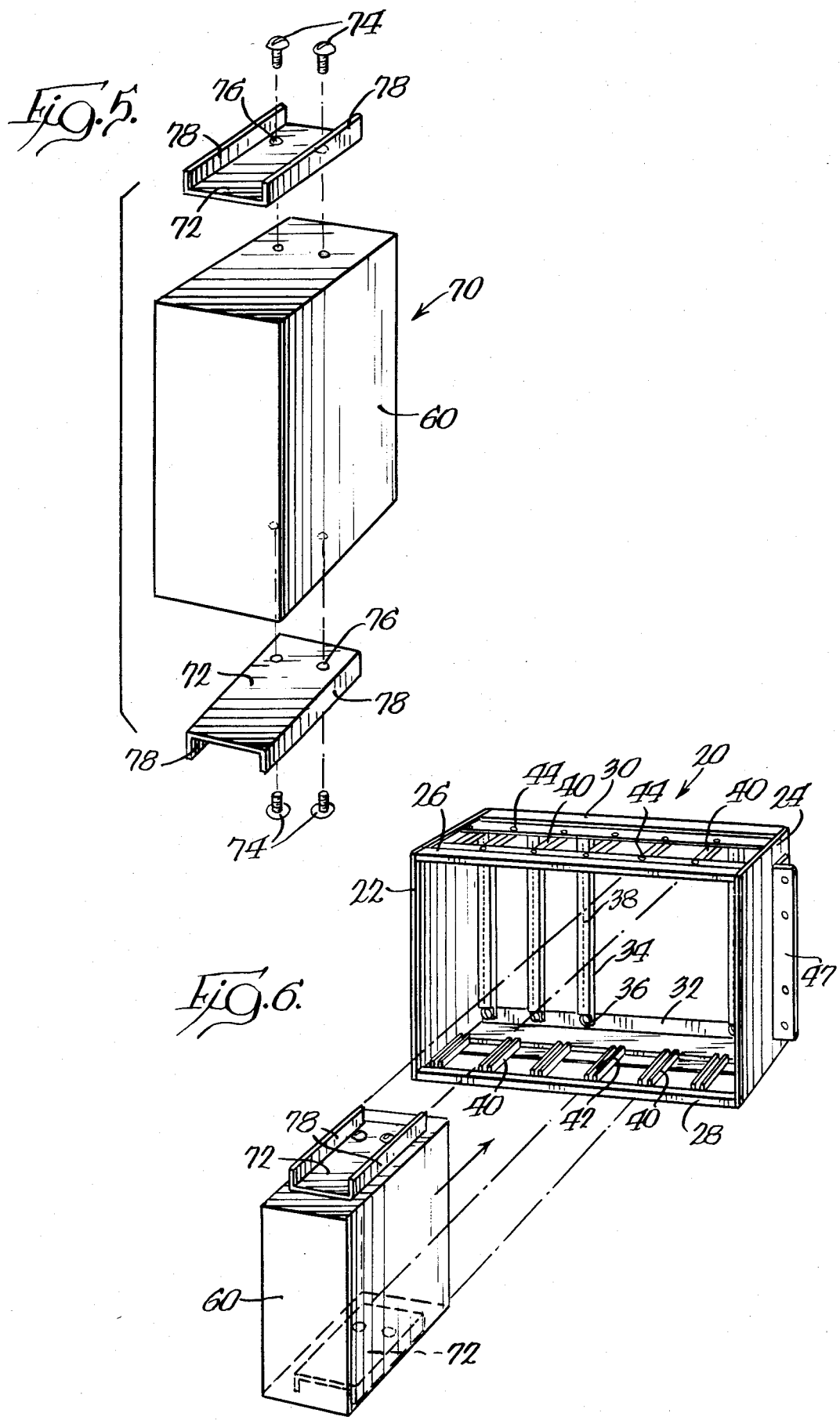

UNIVERSAL CIRCUIT MODULE MOUNTING STRUCTURE

BACKGROUND OF THE INVENTION

The present invention relates to circuit module mounting structures, and in particular to a mounting structure for a circuit module which enables the same to be mounted either between a pair of spaced channels or within circuit card guides.

In the telephony industry circuit module or circuit card mounting shelves provide for apparatus case or relay rack mounting of circuit modules. The mounting shelves usually carry a plurality of card connectors, each having contacts within a slotted area thereof for electrically connecting with contacts on a circuit module extended therein. Card guides along opposite sides of the connectors receive and guide circuit modules into the connectors, and wire wrap pins on the back of the connectors enable electrical connections to be established between circuit modules and with external equipment.

To power the circuit modules, a user may supply his own battery plant. However, it often happens that user supplied battery plant is either not available or impractical, in which case regulated power supplies are used. Heretofore such power supplies have been integrally provided with brackets at their upper and lower ends for mounting the same between perforated channels on the apparatus cases or relay racks remote from the circuit module mounting shelves, with the result that cables are required for connecting the power supplies with the circuit cards. Since to fabricate such cables and connect the same between the power supplies and the remote circuit cards is inconvenient and expensive, it would be desirable if some means were provided for mounting power supplies on the circuit module mounting shelves in close proximity with the circuit modules to be powered.

OBJECT OF THE INVENTION

The primary object of the present invention is to provide a mounting structure for a power supply, which enables the same to be selectively mounted either between a pair of spaced channels or within circuit card guides in a circuit module mounting shelf which carries circuit modules to be powered thereby.

SUMMARY OF THE INVENTION

In accordance with the present invention, there is provided an improved power supply assembly for being mounted either between a pair of elongate channels spaced apart in parallel relationship or within a circuit module mounting shelf having a plurality of pairs of elongate circuit card guides. Each pair of card guides includes a first card guide at an upper end of the module extending between a front and a rear end thereof and a second card guide at a lower end of the module extending between the front and rear ends thereof and parallel to the first card guide, and each card guide has a longitudinal slot therein with the slots in each pair being in facing relationship. Said power supply assembly comprises a power supply, a first pair of mounting brackets, each connectable with an associated one of the channels, a second pair of mounting brackets, each connectable with an associated card guide of at least one pair of card guides, and means for detachably securing each mounting bracket of one of said first and second pairs of mounting brackets to respective ones of upper and lower surfaces of said power supply. With said first pair of mounting brackets secured to said power supply the same is mountable to and between the pair of channels, and with said second pair of mounting brackets secured to said power supply the same is mountable to and between at least one pair of card guides in the circuit module mounting shelf.

The foregoing and other objects, advantages and features of the invention will become apparent upon a consideration of the following detailed description, when taken in conjunction with the accompanying drawings.

BRIEF DESCRIPTION OF THE DRAWINGS

FIG. 1 is a front elevation view of a circuit module mounting shelf and an underlying power supply mounting rack, showing the prior art technique for mounting a power supply between a pair of channels;

FIG. 2 is a front elevation view of a circuit module mounting shelf, showing the same mounting a power supply, which has been provided with mounting brackets in accordance with the teachings of the invention, within card guides on the shelf;

FIG. 3 is a cross sectional side elevation view taken substantially along the lines 3—3 of FIG. 2;

FIG. 4 is a perspective view of the power supply, illustrating one pair of mounting brackets for the power supply which enable the same to be mounted between spaced channels;

FIG. 5 is a perspective view of the power supply, showing another pair of mounting brackets for the power supply which enable the same to be mounted within card guides on the mounting shelf, and FIG. 6 is a perspective view of the power supply and mounting shelf, illustrating the power supply in position for being extended into and supported by card guides on the shelf.

DETAILED DESCRIPTION

With particular reference to FIGS. 1, 3 and 6, there is indicated generally at 20 a circuit module mounting shelf of a type known in the art. The shelf includes a pair of side walls 22 and 24, a pair of mounting channels 26 and 28 respectively extending between upper and lower front corners of the side walls, and a pair of generally L-shaped mounting channels 30 and 32 respectively extending between upper and lower rearward corners of the side walls.

A plurality of circuit card connectors 34 extend in spaced relationship between and are fastened to rearward legs of the L-shaped mounting channels 30 and 32 by screws 36 extended through openings in opposite ends of the connectors and engaged within threaded passages in the rearward legs. Each connector has a longitudinal slot 38, within which a plurality of bifurcated contact pins (not shown) are provided for electrically connecting with associated contacts on a circuit module or circuit card extended into the slot, and wire wrap pins (also not shown) on the back of each connector enable electrical connections to be established between the circuit cards and with external equipment.

To guide circuit cards into the slots 38 in the card connectors 34 a plurality of card guides 40, each having a longitudinal slot 42, are extended and fastened between the mounting channel 26 and the forward leg of the L-shaped mounting channel 30 and between the mounting channel 28 and the forward leg of the L-shaped mounting channel 32 by screws 44 extended through openings in opposite ends of the card guides and engaged within threaded passages in the mounting channels. The arrangement is such that a pair of card guides are associated with each card connector, one at each of the connector upper and lower ends thereof and extending perpendicularly therefrom.

With the card connectors 34 and card guides 40 in place, circuit cards or circuit modules carrying electronic components, for example the single circuit card 46 as shown, are extended into the connectors. Simply, upper and lower edges of the circuit card are entered into the outer ends of the longitudinal slots 42 in a pair of card guides 40, and the card is then moved into and through the slots until a rearward edge of the card, which carries contacts connected with the circuit components on the card, moves into the card connector slot 38 to engage the circuit card contacts with the bifurcated contacts in the slot. The bifurcated contacts are electrically common with associated ones of the wire wrap pins on the back of the card connector, whereby electrical connections may be made with the circuit card components by wire wrapping conductors onto the pins. It is understood, of course, that to prevent damage to the circuit cards and their components, all necessary wire wrap connections are made prior to plugging the cards into the connectors.

As is known, some means must be provided for powering the circuit cards, and to that end a user may supply power by means of battery plant. However, it often happens that battery plant is either not available or impractical, in which case one or more separate power supplies must be used, one for each circuit card mounting shelf 20, which shelves are customarily mounted in vertical arrangement in apparatus cases or relay racks (neither shown) by means of brackets 47. Heretofore, and with reference to FIG. 1 which illustrates the known technique for mounting power supplies, the art has contemplated that a pair of spaced and parallel channels 48 be provided on the apparatus case or relay rack for supporting one or more power supplies, such as the power supply 50. To that end, the power supply is provided with integral mounting flanges or brackets 52 on upper and lower surfaces thereof, and each bracket has a pair of slots 54 in an outwardly extending leg thereof which are alignable with associated threaded passages in the channels, whereby screws 56 extended through the slots and into the passages mount the power supply on the channels. A difficulty encountered with the mounting arrangement is that the power supply is remote from the circuit cards to be powered, so that a cable must be extended between the power supply and the circuit cards, which increases the expense of powering the cards.

To enable a power supply to either be mounted between a pair of channels 48 remote from the circuit cards to be powered thereby, where such a mounting arrangement is necessary or desired, or within a circuit module mounting shelf containing the circuit cards to be powered, the invention contemplates that two different types of mounting brackets be selectively connectable with the power supply, one permitting mounting of the power supply between a pair of channels and the other within a mounting shelf. FIG. 4 illustrates, in accordance with one embodiment, a power supply assembly 58 adapted for being mounted between the pair of channels 48. As compared with the conventional power supply 50 which has integral brackets 52, the power supply assembly 58 includes a power supply 60 to which a pair of L-shaped brackets 62 are detachably connectable by means of screws 64 extended through openings 66 in the brackets into threaded passages in upper and lower surfaces of the power supply. Each bracket has a pair of slots 68 in an outwardly extending leg thereof, and the slots are alignable with associated pairs of threaded passages in the channels for mounting the power supply on the channels by screws 56 extended through the slots and into the channel passages. Thus, by the simple expedient of attaching the brackets 62 to the power supply 60, the power supply may conveniently be mounted between the channels in the same manner as is the power supply 50 as shown in FIG. 1. When so mounted, the power supply is then connected by means of a cable with its associated circuit cards.

In accordance with another embodiment of the invention, and with particular reference to FIG. 5, a power supply assembly is indicated generally at 70 and structured to permit mounting of the power supply 60 within the circuit module mounting shelf itself. The assembly includes a pair of U-shaped mounting brackets 72 which are detachably connectable with upper and lower surfaces of the power supply by means of screws 74 extended through openings 76 in the brackets into threaded passages in the power supply surfaces. Each bracket has a pair of outwardly extending legs 78, and the spacing between the legs is equal to the spacing between the longitudinal slots 42 in an adjacent pair of card guides 40. Consequently, and as illustrated in FIGS. 2, 3 and 6, the power supply assembly may conveniently be mounted within the mounting shelf 20 simply by entering the legs 78 of the brackets into and along the longitudinal slots in upper and lower adjacent pairs of card guides. In this case card connectors 34 are not provided at the rear of the shelf behind the power supply, and the power supply is electrically connected with the circuit cards 46 on the shelf by means of hard wire connections to the power supply and wire wrap connections to the card connector wire wrap terminals without need for a separate cable.

The invention therefore advantageously enables a power supply to be selectively mounted either between a pair of channels remote from circuit cards to be powered or within the mounting shelf which carries the cards, it only being necessary to select the appropriate pair of mounting brackets 62 or 72 for attachment to the power supply.

While one embodiment of the invention has been described in detail, various modifications and other embodiments thereof may be devised by one skilled in the art without departing from the spirit and scope of the invention, as defined in the appended claims.

What is claimed is:

1. An improved power supply for being mounted either between a pair of elongate channels spaced apart in parallel relationship or within a circuit module mounting shelf having a plurality of pairs of elongate circuit card guides, each pair of circuit card guides including a first circuit card guide at an upper end of the circuit module mounting shelf extending between a front and a rear end thereof and a second circuit card guide at a lower end of the circuit module mounting shelf extending between the front and rear ends thereof and parallel to the first circuit card guide, each circuit card guide having a longitudinal slot therein and the slots of each pair being in facing relationship, said power supply including a first pair of mounting brackets, each connectable with an associated one of the pair of elongate channels; a second pair of mounting brackets, each connectable with an associated circuit card guide of at least one pair of circuit card guides; and means for detachably securing each mounting bracket of one of said first and second pairs of mounting brackets to respective ones of upper and lower surfaces of said power supply, whereby with said first pair of mounting brackets secured to said power supply the same is mountable to and between the pair of elongate channels and with said second pair of mounting brackets secured to said power supply the same is mountable to and between at least one pair of circuit card guides in the circuit module mounting shelf, wherein said second pair of mounting brackets includes first and second generally U-shaped brackets each having a generally planar medial portion and a pair of legs extending from opposite sides of said medial portion generally perpendicular thereto and in substantially parallel relationship and said means for detachably securing fastens the medial portion of each said U-shaped bracket to a respective one of said upper and lower power supply supply surfaces with said pairs of legs of said brackets extending outwardly of said power supply, said legs of each said bracket having a spacing therebetween equal to the spacing between the longitudinal slots of adjacent pairs of circuit card guides, whereby said power supply may be mounted in said module mounting shelf by extending said legs into and through the longitudinal slots in an adjacent pair of circuit card guides.

2. An improved power supply as in claim 1, wherein said first pair of mounting brackets includes two L-shaped brackets, said means for detachably securing includes means for releasably fastening each said bracket along one leg thereof to a respective one of said upper and lower surfaces of said power supply to extend the other leg of each said bracket outwardly of said power supply, and each said other leg of said brackets has at least one opening therein, whereby said power supply may be secured to the pair of elongate channels by extending fasteners through said openings and into engagement with the channels.

3. An improved power supply as in claim 2, wherein the pair of elongate channels have threaded passages therein and said first pair of mounting brackets are connected with the pair of channels by extending screws through said at least one opening therein into engagement with the threaded passages to connect the power supply to and between the pair of channels.

4. An improved power supply as in claim 3, wherein said at least one opening in each said other leg of said first pair of brackets comprises a pair of slots in said leg, and each elongate channel has a pair of threaded passages therein, said pair of slots in each said mounting bracket of said first pair being alignable with the pair of threaded passages in respective ones of the channels for fastening said brackets to the channels by screws extended through said slots into engagement with the threaded passages.

5. An improved power supply as in claim 2, wherein said power supply has a pair of threaded passages in each of said upper and lower surfaces thereof, said one leg of each said mounting bracket of said first pair has a pair of apertures therethrough, and said means for detachably securing said first pair of mounting brackets to said power supply includes screws extendable through said apertures into said threaded passages in said power supply.

6. An improved power supply as in claim 1 wherein said power supply has a pair of threaded passages in each of said upper and lower surfaces thereof, each said U-shaped bracket has a pair of openings through said medial portion thereof alignable with said threaded passages, and said means for detachably securing includes screws extendable through said openings in said medial portions into said threaded passages in said power supply.

* * * * *